United States Patent [19]

Wrathall

[11] Patent Number: 4,605,891

[45] Date of Patent: Aug. 12, 1986

[54] SAFE OPERATING AREA CIRCUIT AND METHOD FOR AN OUTPUT SWITCHING DEVICE

[75] Inventor: Robert S. Wrathall, Tempe, Ariz.

[73] Assignee: Motorola, Schaumburg, Ill.

[21] Appl. No.: 622,894

[22] Filed: Jun. 21, 1984

[51] Int. Cl.⁴ .......................... G05F 1/46; H03K 5/08

[52] U.S. Cl. .................................... 323/313; 323/315; 323/277; 323/349; 307/564; 330/257; 330/298

[58] Field of Search ................................ 323/312-317, 323/349, 350, 351, 276, 277, 278, 908, 280; 361/5, 18; 330/288, 298, 297, 257; 307/566, 564

[56] References Cited

U.S. PATENT DOCUMENTS

| | | | |
|---|---|---|---|
| 3,443,191 | 5/1969 | Medlar | 323/278 X |
| 3,522,521 | 8/1970 | Lloyd | 323/313 |
| 3,643,152 | 2/1972 | Matsumura et al. | 323/273 |
| 3,714,549 | 1/1973 | Mason et al. | 323/280 |
| 4,319,181 | 3/1982 | Wrathall | 323/315 |
| 4,352,056 | 9/1982 | Cave et al. | 323/314 |

*Primary Examiner*—Philip H. Leung

*Attorney, Agent, or Firm*—William J. Kubida; Dale E. Jepsen

[57] ABSTRACT

A safe operating area circuit in combination with a current sensing circuit is coupled to an input voltage line and has a control line input in which the combination provides a current limited output on an output voltage line in response thereto. Break-points may be selectably established in the current limit curve for the output switching device by means coupling the input and output voltage lines.

16 Claims, 5 Drawing Figures

SAFE OPERATING AREA CIRCUIT AND METHOD FOR AN OUTPUT SWITCHING DEVICE

BACKGROUND OF THE INVENTION

The present invention relates, in general, to the field of safe operating circuits and methods for an output switching device. More particularly, the circuit and method of the present invention is of special utility in the protection of bipolar power output transistors of use, for example, in a voltage regulator.

Current through an output device, such as a vertical bipolar transistor, must be limited to operation within a parameter defined by a plot of such current with respect to the input-output differential voltage "$V_{IN}$-$V_{OUT}$". Operation at a point beneath this current limit curve is defined as a safe operating area, or "SOA". For obvious reasons then, as this differential voltage increases, current must be concomitantly decreased to insure power constraints stay below this current limit. However, in order to most fully utilize the capability of an output device, operation should ideally track the current limit curve as closely as possible. Therefore, it is necessary to insure that the differential voltage be sensed and current limited in response thereto. An example for effectuating this purpose is disclosed in U.S. Pat. No. 4,319,181 issued on Mar. 9, 1982 to Robert S. Wrathall and assigned to Motorola, Inc., assignee of the present invention. In previous voltage regulators, a circuit was utilized which applied a step approximation to the SOA area of the current limit curve. In general, this approximation is poor and difficult to control. Moreover, this technique does not allow the use of a differential voltage, but rather only the maximum voltage applied to the output device.

Other voltage regulators utilize a relatively similar system having a zener controlled current in the current sense. However, the current sense is accomplished by developing a full $V_{BE}$ across the total current in the output device by means of emitter ballasting equaling a $V_{BE}$ drop.

SUMMARY OF THE INVENTION

It is therefore an object of the present invention to provide an improved safe operating area circuit and method for an output device.

It is further an object of the present invention to provide an improved safe operating area circuit and method for an output device which provides a break point approximation of the current limit curve of an output device to closely match its power constraints.

It is still further an object of the present invention to provide an improved safe operating area circuit and method for an output device which provides highly efficient utilization of an output device within its SOA.

It is still further an object of the present invention to provide an improved safe operating area circuit and method for an output device which is readily and efficiently effectuated and integrated utilizing a minimum of components and integrated circuit area.

The foregoing and other objects are achieved in the present invention wherein there is provided a safe operating area circuit and method in combination with a current sensing circuit coupled to a voltage input line and having a control line input. The combination provides a current limited output on an output voltage line in response thereto by means of an output switching device having first, second and third terminals thereof.

The first terminal is coupled to the input voltage line while the second terminal is connected to the control input line. The third terminal is connected to the output voltage line. Means for controlling a level of current at the voltage output line are coupled between the input and output voltage lines.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
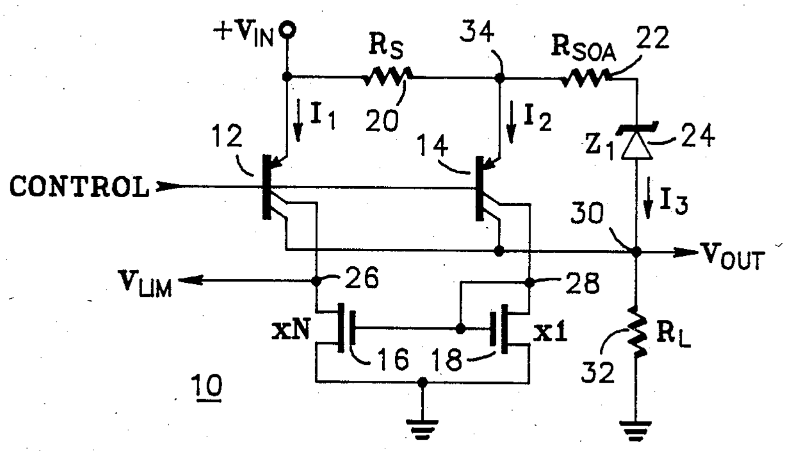
FIG. 1 illustrates a safe operating area circuit in accordance with the present invention in conjunction with a current sensing circuit for use, for example, in a voltage regulator.

With reference to FIG. 1 a safe operating area circuit in accordance with the present invention is shown incorporating a current sensing circuit as disclosed and claimed in U.S. Pat. No. 4,319,181 issuing to Robert S. Wrathall and assigned to Motorola, Inc., assignee of the present invention, the disclosure of which is hereby specifically incorporated by reference.

Safe operating area circuit 10 includes output transistor 12 having its emitter coupled to an input voltage line $V_{IN}$. Output transistor 12, incorporating a split collector configuration has a first collector connected to an output voltage $V_{OUT}$ line 30 and a second collector connected to a limit voltage $V_{LIM}$ line 26. A corresponding output transistor 14 has its emitter resistively coupled to the emitter of output transistor 12 by means of sense resistor 20 having a value $R_S$. Output transistor 14, also a split collector device has a first collector connected to $V_{OUT}$ line 30 and a second collector connected to node 28. The respective base terminals of output transistors 12, 14 are connected to a control input line. As shown, the emitter current in output transistors 12 and 14 is respectively defined as $I_1$ and $I_2$.

N channel transistor 16 has its drain connected to $V_{LIM}$ line 26 and its source connected to circuit ground. Similarly, N channel transistor 18 has its drain terminal connected to node 28 and its source terminal connected to circuit ground. The gate terminals of N channel transistors 16, 18 are connected together at node 28. As shown, N channel transistor 16 is defined as having a width to length ratio divided by the width to length ratio of N channel transistor 18 of "n".

In addition to the current sensing circuit above-described, safe operating area circuit 10 further comprises safe operating area resistor 22 having a value defined as $R_{SOA}$. Safe operating area resistor 22 is connected in series with zener diode 24 between SOA node 34 and $V_{OUT}$ line 30. The current through zener diode 24 is defined as $I_3$. $V_{OUT}$ line 30 is resistively coupled to circuit ground by means of load resistance 32 having a value $R_L$.

Figure 2A:
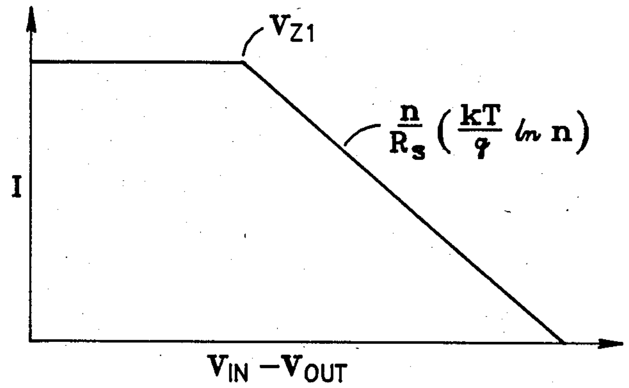
FIGS. 2A and 2B illustrate the break-point approximation of an output device current limit curve for insuring operation within its SOA which may be obtained by use of the safe operating circuit of FIG. 1 and alternative embodiments thereof.

Referring additionally now to FIG. 2A, the operation of safe operating area circuit 10 in providing a break-point approximation of a current limit for an output device is shown. Output transistors 12, 14 incorporate lateral collectors utilized to detect the emissio from their respective emitter. Sense resistor 20 is utilized to reduce the emission of one emitter relative to the other. Output transistors 12, 14 may be "long finger emitter" and "long finger collector" devices although they need not be so. A first lateral collector of output transistors 12, 14 are connected respectively to a current mirror comprising N channel transistors 16, 18. As the current through sense resistor 20 increases, a point is reached where the current mirror of N channel transistors 16, 18 is not satisfied and a current limit signal on $V_{LIM}$ line 26 is generated at the output. By means of safe operating area resistor 22 in conjunction with zener diode 24, the current through sense resistor 20 can be controlled by this voltage dependent source, therefore adding an SOA component to the current limit.

The current through sense resistor 20 is induced by safe operating area resistor 22 and zener diode 24 generating break points in the current limit. The voltage drop, $\Delta V_S$, across sense resistor 20 having a value of $R_S$ is giving by the equation:

$$\Delta V_S = R_S(I_2 + I_3) \quad (1)$$

The same voltage can be expressed in terms of the current through the two emitter elements of output transistors 12, 14 by the equation:

$$\Delta V_S = \frac{kT}{q} \ln\left(\frac{I_1}{I_2}\right) \quad (2)$$

where KTq=$\beta$

Setting these two quantities equal:

$$I_2 + I_3 = \frac{RT}{qR_S} \ln\left(\frac{I_1}{I_2}\right) \quad (3)$$

However, at current limit, the currents $I_1$ and $I_2$ are related by the equation:

$$I_1 = nI_2 \quad (4)$$

Thus, the current $I_1$ at current limit equals:

$$I_1 = \left(\frac{kT}{qR_S} \ln n - I_3\right) n \quad (5)$$

Since this emitter cell is replicated over the entire surface of the power device, a current limit signal has been derived proportional to the current in the main device. Since the voltage drop across sense resistor 20 is very small, the current through zener diode 24, defined as $I_3$, can be approximated by the equation:

$$I_3 \approx (V_{IN} - V_{OUT} + V_{ZN})/R_{SOA} \quad (6)$$

where $V_{ZN}$ equals the voltage rating of zener diode 24

Introducing this quantity into the equation defining current $I_1$.

$$I_1 = \frac{n}{R_S}\left(\frac{kT}{q} \ln n - \frac{(V_{IN} - V_{OUT} - V_{ZN})}{r}\right) \quad (7)$$

Where the quantity "r" is expressed by:

$$r\,R_S = R_{SOA} \quad (8)$$

As shown, the current limit is a function of the differential voltage $V_{IN} - V_{OUT}$. The break points on the current limit curve will occur at a value equal to the voltage rating, $V_{Z1}$, of zener diode 24. The slope of the current limit curve is a function of the value of safe operating area resistor 22.

Figure 2B:
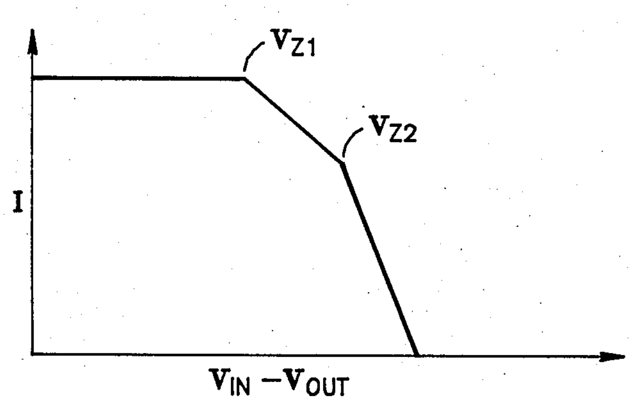

Referring additionally now to FIG. 2B, if multiple zener diodes 24 of various voltage ratings and series connected safe operating area resistors 22 are used, a break-point curve approximating the current limit and safe operating area of the output power device can be generated. Thus, the curve shown in FIG. 2B may be generated by use of the parallel combination of safe operating resistors 22 in series with zener diodes 24 having voltage ratings of $V_{Z1}$, $V_{Z2}$ respectively. Various configurations of such resistors and zener diodes can approximate almost any type of curve by a piecewise model.

Figure 3:
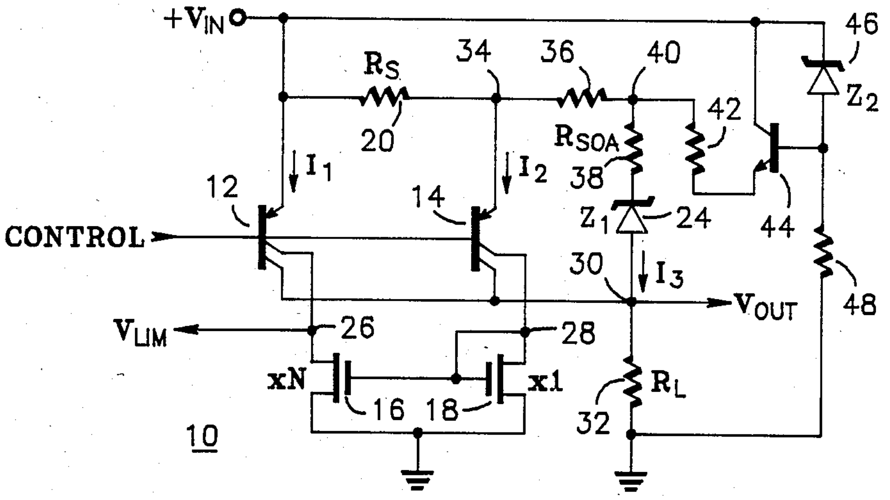
FIG. 3 illustrates an alternative embodiment of a safe operating area circuit it accordance with the present invention.

Referring additionally now to FIG. 3, an alternative embodiment of a safe operating area circuit 10 is shown incorporating a current leveling circuit. With respect to this embodiment, like structure to that above-described to FIG. 1 is similarly numbered and the foregoing description thereof will suffice herefor. In this embodiment, safe operating area circuit 10 includes a resistance having a value $R_{SOA}$ comprising the series connection of resistors 36 and 38 with zener diode 24. The interconnection between resistors 36 and 38 is defined as node 40. An NPN transistor 44 has its collector connected to an input voltage line $V_{IN}$. The emitter of NPN transistor 44 is resistively coupled to node 40 by means of resistor 42. The base terminal of NPN transistor 44 is likewise resistively coupled to circuit ground by means of bias resistor 48. A zener diode 46 having a voltage rating $V_2$ couples the base and collector terminal of NPN transistor 44 as shown.

Figure 4:
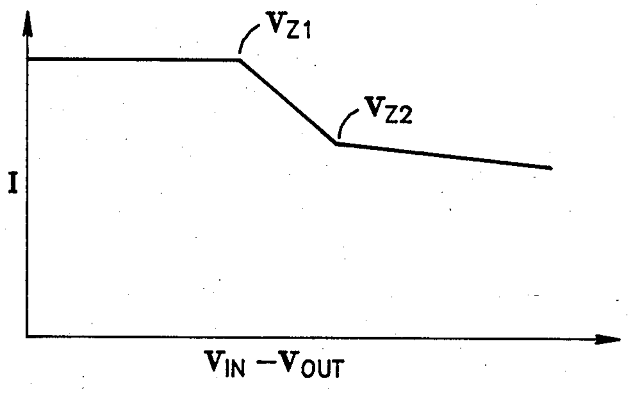
FIG. 4 illustrates a current limit curve for insuring operation within an output device's SOA by use of the safe operating area circuit shown in FIG. 3.

Referring additionally to FIG. 4, the current limit curve approximation which may be obtained by use of safe operating area circuit 10 of FIG. 3 is shown. In this embodiment, the first break-point will occur at a value $V_{Z1}$ equal to the voltage rating of zener diode 24. However, a second break-point having a voltage of value $V_{Z2}$ equal to the voltage rating of zener diode 46 will occur whereupon the slope of the current limit curve can be made relatively flat. Assuming the voltage rating of zener diode 46 to be greater than that of zener diode 24, when the voltage on the base of NPN transistor 44 exceeds the voltage at node 40 plus a $V_{BE}$ level (approximately 0.7 volts), then the voltage at node 40 will follow the voltage at the base of NPN transistor 44 thus accounting for the generally flat aspect of the current limit curve of FIG. 4 when the differential voltage exceeds $V_{Z2}$.

With respect to all above-mentioned embodiments, it should be pointed out that if the resistors comprising $R_{SOA}$ and $R_S$ are made of the same material, the resultant safe operating area circuit will have the same temperature coefficient as $R_S$.

What has been provided therefore, is an improved safe operating area circuit and method for an output device which provides a break-point approximation of the current limit curve of an output device to closely match its power constraints. The safe operating area circuit and method for an output device of the present invention provides highly efficient utilization of an output device within its SOA and is readily and efficiently effectuated and integrated utilizing a minimum of components and integrated circuit area.

While there have been described above the principles of the invention in conjunction with specific apparatus, it is to be clearly understood that this description is made only by way of example and not as a limitation to the scope of the invention.

I claim:

1. A safe operating area circuit in combination with a current sensing circuit coupled to an input voltage line and having a control line input, said combination for providing a current limited output on an output voltage line in response thereto, comprising:

an output switching device having first, second and third terminals thereof, said first terminal being coupled to said input voltage line, said second terminal being connected to said control input line and said third terminal being connected to said output voltage line; and means coupling said input and output voltage lines for selectably controlling a level of said current on said output voltage line.

2. The safe operating area circuit of claim 1 wherein said output switching device comprises a bipolar transistor.

3. The safe operating area circuit of claim 2 wherein said bipolar transistor is a split collector device.

4. The safe operating area circuit of claim 2 wherein said bipolar transistor is a PNP device.

5. The safe operating area circuit of claim 1 wherein said controlling means comprises a resistively coupled reference voltage device.

6. The safe operating area circuit of claim 5 wherein said reference voltage device is a zener diode.

7. The safe operating area circuit of claim 1 wherein said controlling means further comprises a current leveling circuit.

8. A circuit for sensing current, comprising: a first transistor having a control electrode, a first current carrying electrode coupled to a first voltage terminal, and a second current carrying electrode, the first transistor also having an additional current carrying electrode capable of carrying a predetermined ratio of current carried by the second current carrying electrode; a second transistor having a control electrode coupled to the control electrode of the first transistor and having a first current carrying electrode and a second current-carrying electrode, the second transistor also having an additional current carrying electrode capable of carrying a predetermined ratio of current carried by the second current carrying electrode of the second transistor; a resistor coupled between the first current carrying electrode of the second transistor and the first voltage terminal; a third transistor having a first and a second current carrying electrode and having a control electrode, the first current carrying electrode of the third transistor being coupled to the additional current carrying electrode of the first transistor; and a fourth transistor having a first and a second current carrying electrode and having a control electrode coupled to its first current carrying electrode, the second current carrying electrode of the fourth transistor being coupled to the second current carrying electrode of the third transistor, and the first current carrying electrode of the fourth transistor being coupled to the additional current carrying electrode of the second transistor, and wherein the third transistor is capable of carrying more current than the fourth transistor; and means coupling the first and second current carrying electrodes of the second transistor for selectably controlling an output level of current from the circuit.

9. The circuit of claim 8 wherein the first and second transistors are bipolar devices and the third and fourth transistors are MOS devices.

10. The circuit of claim 8 wherein the controlling means comprises a resistively coupled reference voltage device.

11. The circuit of claim 10 wherein the reference voltage device is a zener diode.

12. The circuit of claim 8 wherein the controlling means further comprises a current leveling circuit.

13. A method for ensuring operation of a current sensing circuit within a safe operating area, said circuit being coupled to an input voltage line and having a control line input thereto, said circuit for providing a current limited output on a output voltage line in response thereto, comprising the steps of:

providing an output switching device having first, second and third terminals thereof, said first terminal being coupled to said input voltage line, said second terminal being connected to said control input line and said third terminal being connected to said output voltage line; and coupling said input and output voltage lines by means for selectably controlling the level of said current on said voltage output line.

14. The method of said claim 13 wherein said step of providing is carried out by means of a bipolar transistor.

15. The method of said claim 13 wherein said step of coupling is carried out by means of a resistively coupled reference voltage device.

16. The method of claim 13 wherein said step of coupling further comprises the step of:

providing a current leveling circuit.

* * * * *